US008854150B2

United States Patent
van der Avoort et al.

(10) Patent No.: US 8,854,150 B2
(45) Date of Patent: Oct. 7, 2014

(54) RESONATOR AND METHOD OF CONTROLLING THE SAME

(75) Inventors: Casper van der Avoort, Waalre (NL); Jozef Thomas Martinus van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 22 days.

(21) Appl. No.: 13/446,894

(22) Filed: Apr. 13, 2012

(65) Prior Publication Data
US 2012/0262242 A1    Oct. 18, 2012

(30) Foreign Application Priority Data

Apr. 18, 2011   (EP) .................................. 11162888

(51) Int. Cl.
| H03B 5/30 | (2006.01) |
| H01L 41/053 | (2006.01) |
| H03H 9/09 | (2006.01) |
| H03H 9/17 | (2006.01) |
| H03H 9/54 | (2006.01) |
| H03H 9/02 | (2006.01) |
| H03H 9/24 | (2006.01) |

(52) U.S. Cl.
CPC ....... *H03H 9/02433* (2013.01); *H03H 9/02338* (2013.01); *H03H 2009/02456* (2013.01); *H03H 2009/02488* (2013.01); *H03H 9/2452* (2013.01)
USPC ............ 331/156; 310/345; 310/348; 333/186

(58) Field of Classification Search
USPC .......................... 310/311, 345, 348, 365, 366; 331/116 FE, 116 M, 116 R, 154, 156; 333/186, 200
See application file for complete search history.

(56) References Cited

U.S. PATENT DOCUMENTS

| 3,490,056 A | * | 1/1970 | Milton et al. .................. 333/186 |
| 3,602,842 A | * | 8/1971 | Smith ....................... 331/116 M |
| 5,455,547 A | * | 10/1995 | Lin et al. ......................... 333/186 |
| 5,491,604 A | * | 2/1996 | Nguyen et al. ................. 361/278 |
| 5,998,911 A | * | 12/1999 | Kikuchi et al. ................ 310/367 |
| 6,046,531 A | * | 4/2000 | Kikuchi et al. ................ 310/367 |
| 6,424,074 B2 | * | 7/2002 | Nguyen ....................... 310/309 |
| 6,624,726 B2 | * | 9/2003 | Niu et al. ..................... 333/197 |
| 7,312,553 B2 | * | 12/2007 | Laermer ....................... 310/312 |

(Continued)

FOREIGN PATENT DOCUMENTS

| FR | 2946479 A1 | 12/2010 |
| WO | 2004/053431 A2 | 6/2004 |
| WO | 2010/035184 A1 | 4/2010 |
| WO | 2010/116332 A1 | 10/2010 |

OTHER PUBLICATIONS

Abdolvand, R. et al. "Enhanced Power Handling and Quality Factor in Thin-Film Piezoelectric-on-Substrate Resonators", IEEE Ultrasonics Symposium, pp. 608-611 (Oct. 2007).
Bontemps, J. et al. "56 MHZ Piezoresistive Micromechanical Oscillator", IEEE Solid-State Sensors, Actuators and Microsystems Conf., Transducers, pp. 1433-1436 (Jun. 2009).
Hsu, W-T. "Vibrating RF MEMS for Timing and Frequency References", IEEE MTT-S International Microwave Symposium Digest, pp. 672-675 (Jun. 2006).

(Continued)

*Primary Examiner* — Levi Gannon

(57) ABSTRACT

A resonator in which in addition to the normal anchor at a nodal point, a second anchor arrangement is provided and an associated connecting arm between the resonator body and the second anchor arrangement. The connecting arm connects to the resonator body at a non-nodal point so that it is not connected to a normal position where fixed connections are made. The connecting arm is used to suppress transverse modes of vibration.

10 Claims, 6 Drawing Sheets

(56) References Cited

U.S. PATENT DOCUMENTS

| | | | |
|---|---|---|---|
| 7,990,233 B2* | 8/2011 | Suzuki | 333/186 |
| 8,143,971 B2 | 3/2012 | Beek et al. | |
| 8,269,578 B2* | 9/2012 | Phan Le et al. | 333/186 |
| 8,493,157 B2* | 7/2013 | Steeneken et al. | 331/154 |
| 8,497,747 B1* | 7/2013 | Wojciechowski et al. | 333/186 |
| 2009/0153267 A1 | 6/2009 | Lutz et al. | |
| 2010/0026421 A1 | 2/2010 | Beek et al. | |
| 2010/0181868 A1 | 7/2010 | Gaidarzhy et al. | |
| 2010/0283353 A1 | 11/2010 | van der Avoort | |
| 2010/0314969 A1 | 12/2010 | Gaidarzhy et al. | |
| 2011/0025426 A1 | 2/2011 | Steeneken et al. | |
| 2011/0127625 A1 | 6/2011 | van der Avoort et al. | |
| 2012/0092082 A1 | 4/2012 | Hentz et al. | |

OTHER PUBLICATIONS

Kaajakari, V. et al. "Nonlinear Limits for Single Crystal Silicon Microresonators", J. of Microelectromechanical Systems, vol. 13, No. 5, pp. 715-724 (Oct. 2004).

van der Avoort, C. et al. "Amplitude Saturation of MEMS Resonators Explained by Autoparametric Resonance", J. of Micromechanics and Microengineering, vol. 20, 10501, 15 pgs. (2010).

Xie, Y. et al. "Spurious Mode Suppression in UHF Micromechanical Extensional Wine-Glass Ring Resonators", IEEE Int'l. Conf. on Micro Electro Mechanical Systems, pp. 219-222 (Jan. 2005).

Extended European Search Report for European Patent Appln. No. 1162888.9 (Sep. 26, 2011).

\* cited by examiner

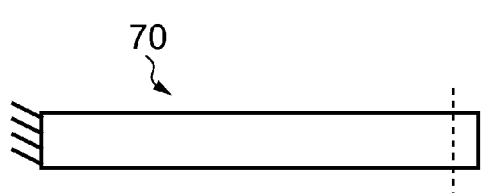
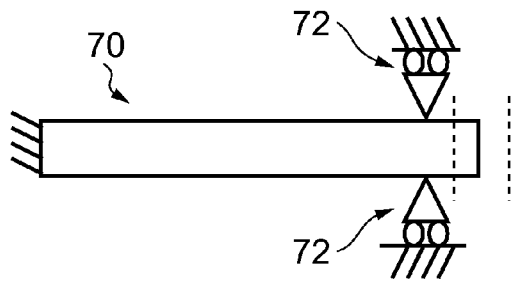
FIG. 7a        FIG. 7b
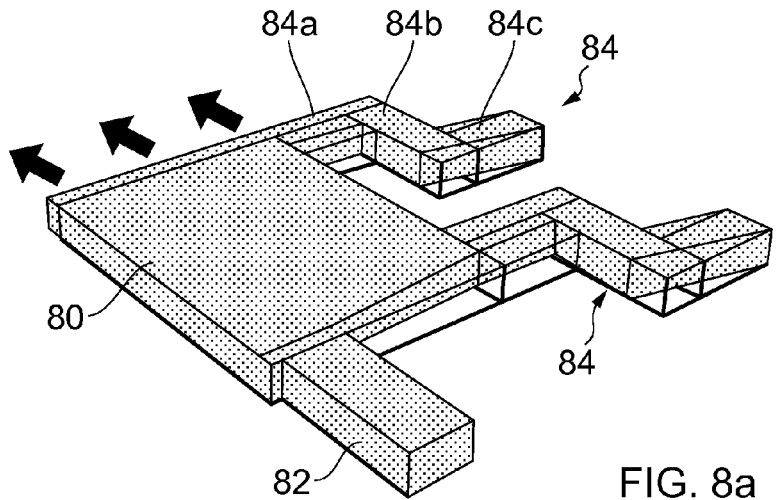
FIG. 8a
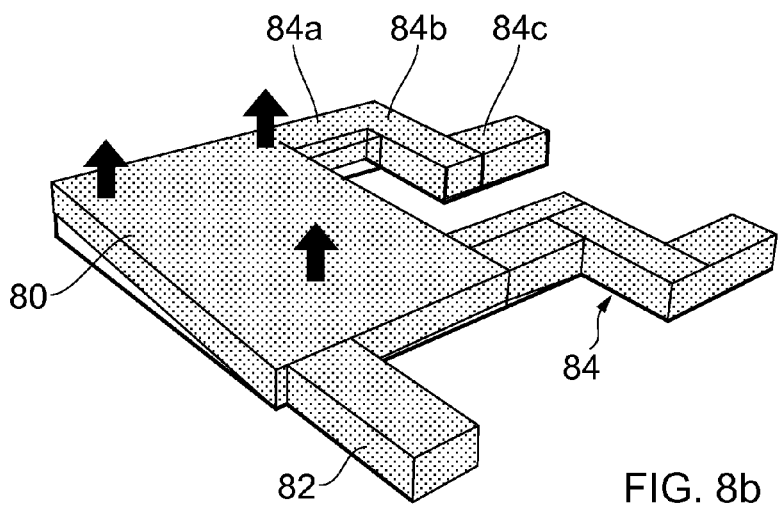
FIG. 8b

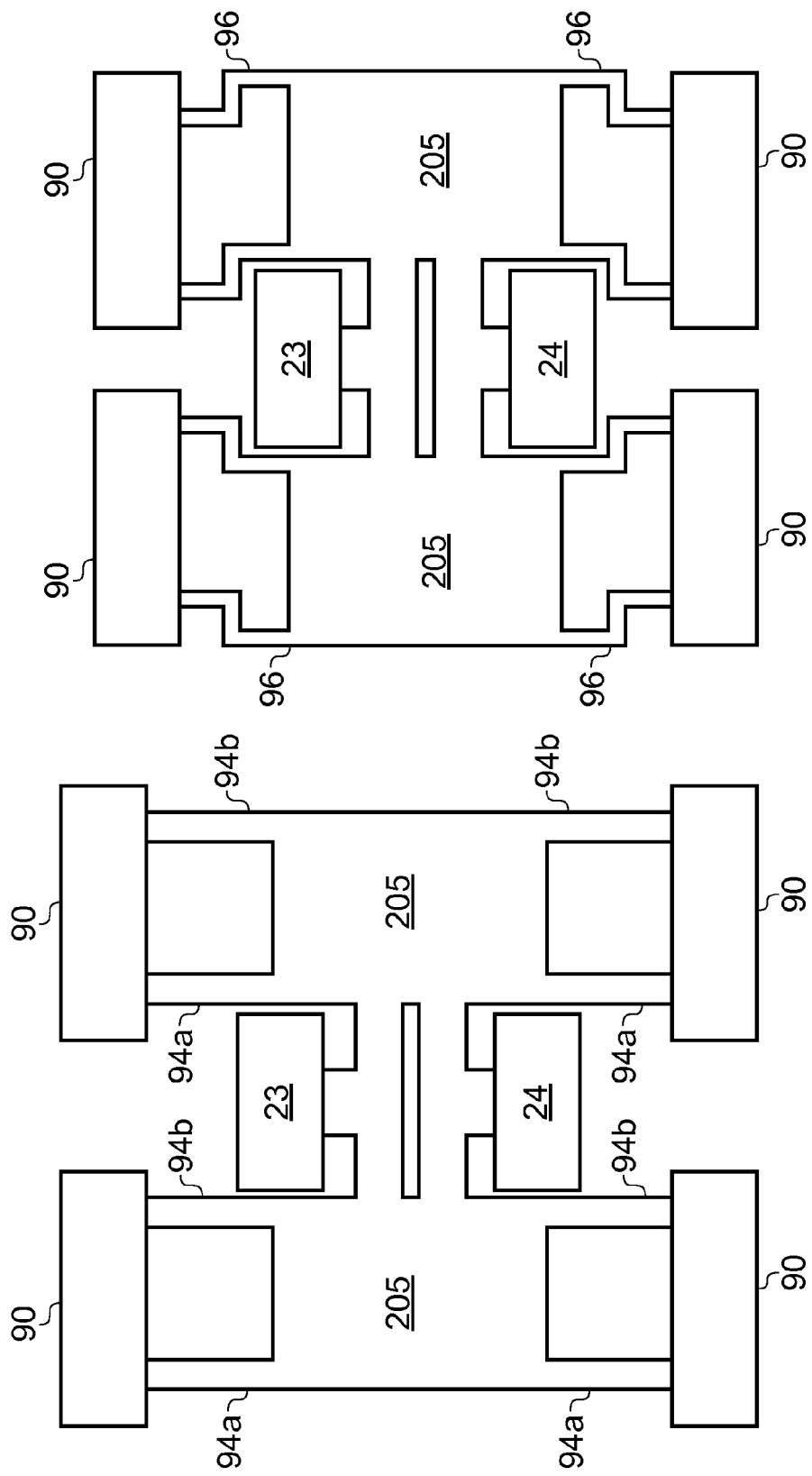

RESONATOR AND METHOD OF CONTROLLING THE SAME

CROSS-REFERENCE TO RELATED APPLICATIONS

This application claims the priority under 35 U.S.C. §119 of European patent application no. 11162888.9, filed on Apr. 18, 2011, the contents of which are incorporated by reference herein.

This invention relates to resonators, for example MEMS resonators.

In various products MEMS resonators are replacing quartz resonators as reference timing devices; they serve as reference resonators in oscillator circuits or as clocking reference to synchronise operations in digital circuitry. MEMS resonators offer the advantage of small dimensions (especially the small height is considered an advantage) with low-cost fabrication. In another application, MEMS resonators can also be combined to form a high-quality filter.

In oscillator circuits, the most important demands on the MEMS resonator are:

(i) a stable resonance frequency by having low phase noise and low jitter, (ii) a high quality factor, to minimise the contribution of the MEMS resonator to the phase noise of the oscillator, and (iii) a non-distorted large amplitude output signal to give a high signal-to-noise ratio of the oscillator and for a linear oscillator output. A high signal-to-noise ratio also enables the low phase noise and jitter to be achieved.

If employed in a filter, MEMS resonators should meet the same demands for different reasons:

(i) a stable resonance frequency to have stable filter operation (ii) a high quality factor to give a low insertion loss, and (iii) non-distorted large amplitude output signal, to give a large dynamic range.

MEMS resonators exhibit a limit to the amplitude of the resonant oscillations which is below that which would be expected from the mechanical design. The origin of this limitation has only been fully understood very recently, and relates to the transfer of energy from the desired mode of vibration (eigenmode) to other eigenmodes.

According to the invention, there is provided a resonator comprising a resonator body and actuation electrodes for driving the resonator into a resonant mode, in which the resonator body vibrates parallel to a first axis; and a detection arrangement for detecting the vibration in the first axis direction and generating an electrical output signal derived from the vibration, wherein the resonator comprises a first anchor arrangement at which the resonator is fixed in position, wherein the first anchor arrangement connects to the resonator body at a nodal point where no movement is induced by the vibration, and wherein the resonator comprises a second anchor arrangement, and a connecting arm between the resonator body and the second anchor arrangement, wherein the connecting arm connects to the resonator body at a non-nodal point.

The invention enables the stable operation of the principal vibration mode (such as the length-extensional vibration mode) of a MEMS resonator to be extended. In previous designs, at a certain vibration level, this mode cannot be brought to vibrate more strongly. The cause is that parasitic out-of-plane modes are excited at this point. These parasitic modes have a transversal vibration component.

The invention uses additional anchor points and connecting arms that are designed not to hamper the principal vibration mode, but which are designed to suppress or restrict all other vibrations.

The connection arms can be thought of as guides in that they limit the movement in one direction but permit free movement along the principal vibration axis.

For example, the connecting arm can have the same matched resonant frequency as the resonator mass for vibrations in the first axis direction, but a non-matched resonant frequency for vibrations in a transverse direction.

The invention results in a structure in which the resonator is attached to the fixed external surroundings at more points than only the nodal (e.g. central) region.

Preferably, the connecting arm extends from the resonator body in a direction transverse to the first axis direction.

In one set of examples, the resonator body has two free ends and the first anchor arrangement connects to the resonator body centrally between the two free ends, and one or more connecting arms connect to each free end. This gives a symmetrical arrangement for known length-extensional resonators with two free ends.

The resonator body can for example comprise a pair of expansion arms which extend along the first axis direction, with a head at each end of the pair of expansion arms, wherein the first anchor arrangement connects to the middle of the expansion arms and the connecting arm connects to the head. This is an arrangement of the invention applied to a so-called dog-bone resonator.

A first connecting arm can extend outwardly in a first direction transverse to the first axis direction from one head, a second connecting arm extending outwardly in a second opposite direction transverse to the first axis direction from the one head, a third connecting arm extending outwardly in the first direction transverse to the first axis direction from the other head and a fourth connecting arm extending outwardly in the second opposite direction transverse to the first axis direction from the other head.

This gives a structure that is symmetric about the first axis as well as symmetric about an axis perpendicular to the first axis direction (and therefore 180 degree rotationally symmetrical).

There can be a first pair of connecting arms extending outwardly in a first direction transverse to the first axis direction from one head, a second pair of connecting arms extending outwardly in a second opposite direction transverse to the first axis direction from the one head, a third pair of connecting arms extending outwardly in the first direction transverse to the first axis direction from the other head and a fourth pair of connecting arms extending outwardly in the second opposite direction transverse to the first axis direction from the other head.

The use of multiple connecting arms enables more parasitic modes to be suppressed.

In all designs, the or each connecting arm can have a first portion transverse to the first axis direction, a second portion parallel to the first axis direction and a third portion transverse to the first axis direction. This Z shaped design reduces stresses induced in the resonator.

The invention also provides a method of controlling a resonator which comprises a resonator body and actuation electrodes for driving the resonator into a resonant mode, in which the resonator body vibrates parallel to a first axis, the method comprising:

fixing the resonator at a first anchor arrangement, wherein the first anchor arrangement connects to the resonator body at a nodal point where no movement is induced by the vibration, fixing the resonator at a second anchor arrangement, by connecting a connecting arm between the resonator body and the second anchor arrangement, wherein the connecting arm connects to the resonator body at a non-nodal point, wherein the method comprises using the connecting arm to suppress modes of vibration transverse to the first axis direction and avoiding damping of the main vibration mode in the first axis direction by connecting the connecting arm to the second anchor arrangement at a nodal point of the vibrations of the combined resonator mass and connecting arm;

detecting the vibration in the first axis direction; and generating an electrical output signal derived from the vibration.

Examples of the invention will now be described with reference to the accompanying drawings, in which:

FIG. 7 shows in schematic form the aim of the design of the invention;

FIG. 8 shows one way to implement the connecting arm of the invention; and

MEMS resonators are designed such that an actuation signal excites one of the resonator's eigenmodes.

Figure 1:
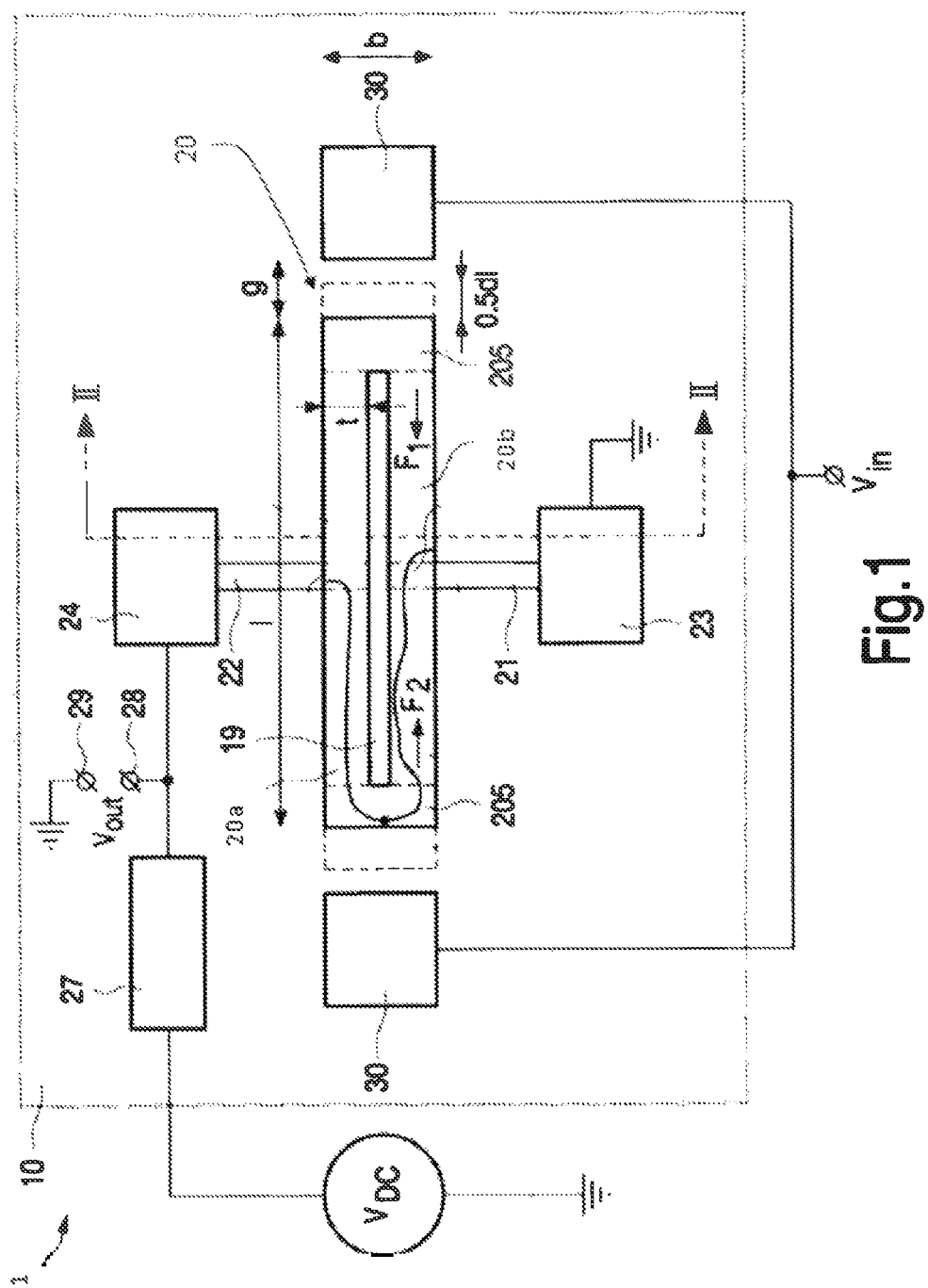
FIG. 1 shows a known resonator.

FIG. 1 shows a resonator designed to vibrate in a length-extensional mode when an ac actuation voltage is applied. If properly designed, the actuation signal does not excite other modes (like bending modes or torsion modes in this example).

The design shown in FIG. 1 is a known piezoresistive MEMS resonator, which is described in more detail in WO 2004/053431.

The resonator 1 shown in FIG. 1 comprises a substrate 10 which is a silicon wafer. Alternatively, the substrate 10 may be a gallium arsenide wafer or it may comprise any other semi-conducting, metal or dielectric material. For resonators 1 designed for operation at frequencies above 10 MHz it is advantageous to use a substrate 10 comprising a dielectric such as, e.g. glass, because this reduces the loss of electromagnetic energy dissipated in the substrate.

The resonator 1 further comprises an electrically conductive resonator element 20 having two parallel connecting elements 20a,20b. The resonator extends in a longitudinal direction having a length l along a first axis which is the axis along which the intended vibrations arise, for operation in bulk mode. It is attached to the substrate 10 via support elements 21 and 22 which are connected to anchor elements 23 and 24, respectively. The anchor elements 23 and 24 are affixed to the substrate 10. The resonator element 20 and the support elements 21 and 22 are free from the substrate 10 except for the connection via the anchor elements 23 and 24.

Figure 2:
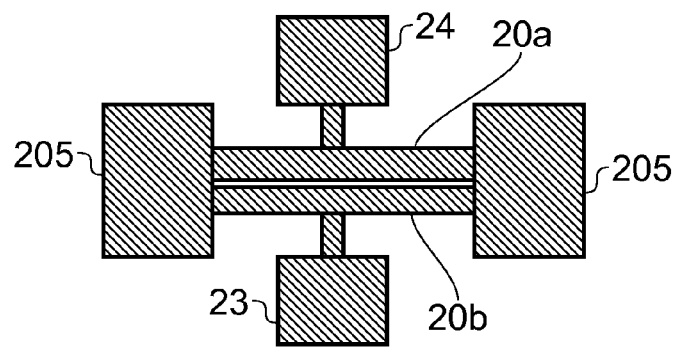
FIG. 2 shows a modification to the resonator design of FIG. 1.

The resonator element 20 has two outer ends 205 in the longitudinal direction. These can be larger than the combined width of the connecting beams 20a,20b and spacing 19 to define wider resonator masses at the ends, and thereby define a so-called dog-bone shape. This is shown in FIG. 2.

Referring back to FIG. 1, each of the outer ends 205 is faced by a respective electrode of the electrically conductive actuator 30, and is spaced from the electrode by an actuation gap g. The actuators can be considered to be gate terminals, in that the control input is applied to these terminals. The actuator 30 is able to receive an actuation potential difference VIN with respect to the resonator element 20 for elastically deforming the resonator element 20, using the electrostatic force. The actuation potential difference is a function of the input signal applied to the resonator 1. In addition to the input signal the actuation potential difference may typically further contain a DC component. The elastic deformation comprises a change of the length l by an amount dl shown in FIG. 1.

A feedback system controls the frequency of the actuation voltage, and the feedback loop stabilises at resonance with the actuation voltage frequency the same as the physical resonant frequency of the resonator.

The resonator element 20 is part of an oscillator circuit which is able to conduct an electrical current through the resonator element 20. The resonator element 20 is electrically connected to the positive or negative pole of a DC voltage source VDC via an auxiliary resistor 27, the anchor element 24 and the support element 22. The anchor 24 can be considered to be a drain terminal in that the DC voltage bias is applied to this terminal to drive a bias current through the device. The resonator element 20 is further connected to ground via the support element 21 and the anchor element 23. The anchor 23 can be considered to be a source terminal in that the bias current is collected at this terminal. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises the two mutually parallel beams 20a,20b each of which is affixed to a respective support element 21 and 22. The two beams are connected with each other at the two outer ends by elements 205. The central part 19 has been created during a lithography step and etching step. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference Vout between the measurement point 28 and the reference point 29 which is connected to ground.

In an alternative embodiment, not shown, the auxiliary resistor 27 is not situated between the voltage source and the anchor element 24, but instead between the anchor element 23 and ground. In this case the measurement point 28 is situated between the auxiliary resistor 27 and the anchor element 23.

In yet another embodiment, not shown either, the DC voltage source VDC and the auxiliary resistor 27 are omitted. The anchor element 24 is connected to the positive pole of a current source and the anchor element 23 is connected to the negative pole of the current source. The measurement point 28 is situated between the positive pole of the current source and the anchor element 24, and the reference point 29 is situated between the anchor element 23 and the negative pole of the current source. Thus, a voltage is measured for a constant current, or else a current portion is measured for a constant total voltage.

The output signal is again a function of the change dl of the length l as will be understood by those skilled in the art. Thus, sensing using current bias or voltage bias can be employed.

The resulting mechanical resonance is in-plane of the drawing and is symmetrical. As mentioned above, the left and right parts of the resonator can be enlarged to define masses of relatively larger stiffness than the intermediate beams, so the compression and expansion that cause the resonator-vibration occurs in the beams.

Since the mechanical vibration is symmetrical, the centre of the structure between the drain and source 24,23 remains mechanically fixed as well.

The so called actuation-gap on each side is located between the gate electrodes 30 and the resonator mass and is in the order of a few hundred nm.

The resonator may be manufactured using a technique well known in the field of micro electromechanical systems (MEMS).

Figure 3:
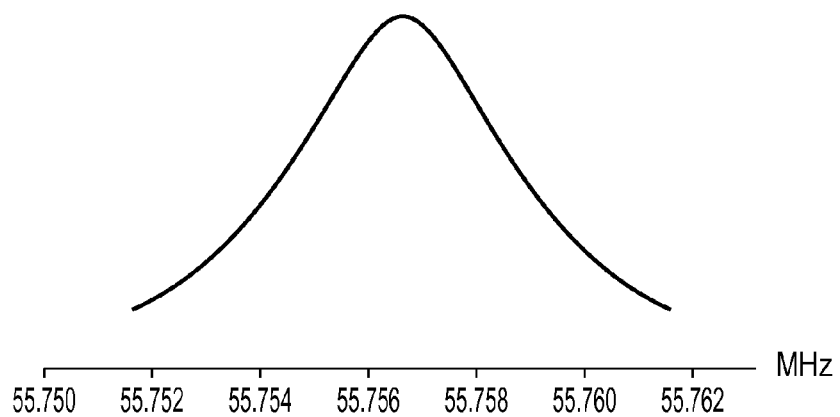
FIG. 3 shows the amplitude vs. frequency characteristics for the resonator of FIG. 2.

A plot of the vibration amplitude versus the actuation frequency is shown in FIG. 3. As shown, the resonator has a vibration amplitude which has a peak at a specific resonant frequency.

Figure 4:
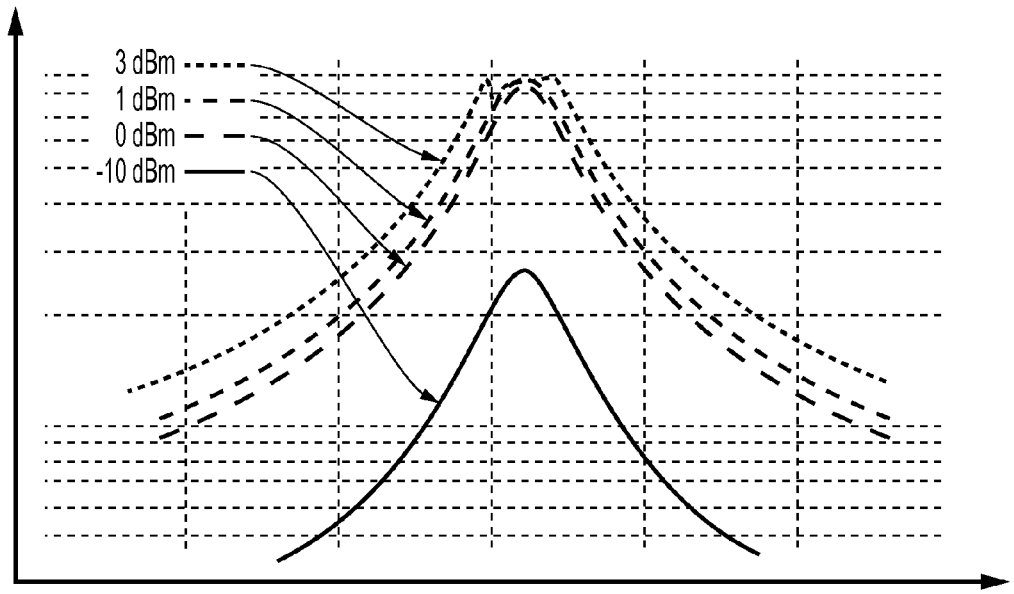
FIG. 4 shows how the amplitude vs. frequency characteristic can become clipped.

Ideally, the MEMS resonator is a purely linear device: if the actuation voltage doubles then the vibration amplitude doubles. Unfortunately, amplitude 10 saturation is observed, meaning that the peak of the vibration amplitude peak is limited to a fixed level. This is shown in FIG. 4, which shows the amplitude plots of FIG. 3 (vibration amplitude vs. actuation frequency) for different actuation voltages. The actuation level is expressed in dBm, providing a measure of signal power.

For the larger actuation voltages, the capping can be seen.

This undesired saturation effect has been reported from groups all over the world and hinders successful use of MEMS resonators for oscillator and filter applications.

The origin of this amplitude saturation has only very recently been revealed. If its vibration amplitude is above a particular threshold, the length-extensional vibration excites another eigenmode (or a combination of eigenmodes), which will be referred to as a parasitic mode.

The parasitic mode drains energy from the desired length-extensional mode. An increase in actuation amplitude does not lead to an increased amplitude of the desired mode, but rather to an increase of amplitude of the parasitic mode. This effect is called autoparametric resonance and is discussed in C van der Avoort et al "Amplitude saturation of MEMS resonators explained by autoparametric resonance" 2010 J. Micromech. Microeng. 20 105012.

Figure 5:
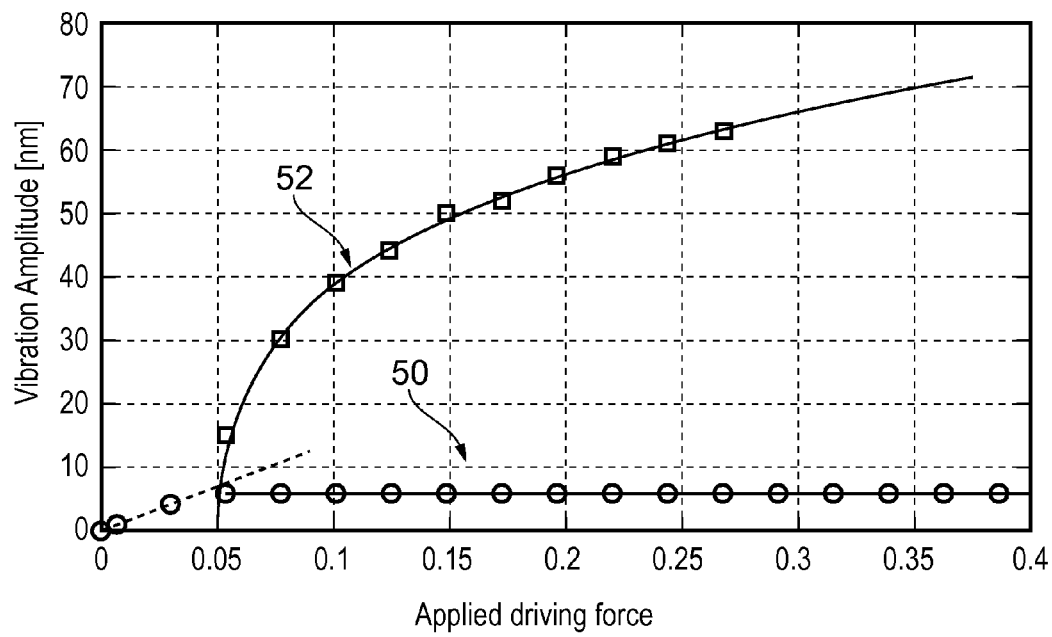
FIG. 5 shows how the clipping is related to parasitic vibration modes.

This effect is shown in FIG. 5, which shows actual measurements of saturation. The electrical output generated by the longitudinal vibration (plot 50) is saturated at a certain point. Optical vibration measurements of the out-of-plane vibration are shown as plot 52. These occur at the eigenfrequency for the out-of-plane mode, which is different from the driven longitudinal mode. This shows an increasing amplitude of this mode as the driving level is further increased.

Thus, the regular electrical response of the resonator is limited, and beyond a certain driving force level the electrical output signal does not grow anymore.

When the principal mode is a length-extension mode, the parasitic modes involved are bending or torsion modes or combinations of them. In either of these modes there is a transversal (i.e. out-of-plane) vibration component.

The energy drainage due to autoparametric resonance occurs even for relatively small length-extensional vibration amplitudes if the operation frequency of the resonator (i.e. the actuation frequency) exactly matches the eigenfrequency of the parasitic mode. Thus, under the circumstance that there is an exact frequency match, the MEMS resonator does not meet the demand of having a non-distorted large amplitude output signal.

There are also usually a variety of parasitic modes with eigenfrequencies that lead to interaction in the vicinity of the operation frequency.

A method is therefore desired to simultaneously suppress all unwanted out-of-plane modes.

The invention provides a resonator in which in addition to the normal anchor at a nodal point, a second anchor arrangement is provided and an associated connecting arm between the resonator body and the second anchor arrangement. The connecting arm connects to the resonator body at a non-nodal point so that it is not connected to a normal position where fixed connections are made. The connecting arm connects to the second anchor arrangement at a nodal point of the vibrations of the combined resonator mass and connecting arm. This means that the second anchor can be considered as at a nodal point of the combination of the connecting arm and the resonator mass. They can together have the same resonant frequency as the resonator mass alone (without the connecting arm) so that the desired resonance is not damped.

The invention is based on suppressing a transverse mode, e.g. a bending mode, so that the critical value can be shifted and the regular response of the principal vibration mode can achieve larger values. It is known that the suspension of a resonator at a nodal point of the vibration mode is favourable for the quality factor of the resonator, i.e. the resonator will show low damping or dissipative losses. The invention is based on altering the resonator structure, to maintain the desired requirement that in the desired mode of operation the resonator is attached to the outside world only at nodal (non-moving) points, but to suppress the other parasitic modes of operation.

The invention in particular makes use of additional suspension (anchor) points on the resonator. These suspension points do not hamper the intended motion and therefore act as frictionless guiders of this motion. On the other hand, these same suspensions should limit/restrict any other motion of the resonator.

With reference to FIG. 5, the aim of the invention is to shift the plot 52 towards an increasing driving force (to the right), since the level of driving force at which energy is transferred to the parasitic mode determines when the vibration amplitude of the principal mode becomes capped. This is at a driving force of 0.05 (arbitrary units) in FIG. 5. By shifting plot 52 to the right, more of the linear initial part of plot 50 is effective before the capping takes place.

Figure 6:
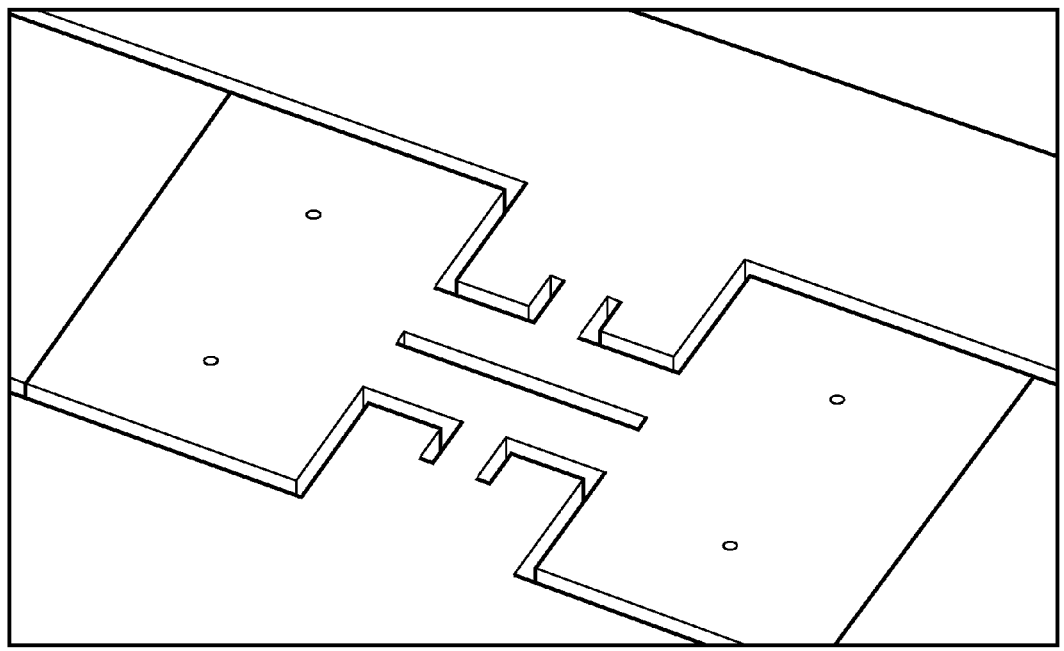
FIG. 6 shows the structure of resonator used to demonstrate how the invention can be implemented.

FIG. 6 is a scanning electron microscope micrograph of the type of resonator shown in FIG. 2. The structure is simulated numerically in order to find resonance modes and corresponding frequencies.

FIG. 7 illustrates schematically how guides are used to suppress out-of-plane vibrations. FIG. 7a represents the unguided resonator 70: it is clamped on one side and free at the other end, giving a range of movement shown by dotted lines. The operated resonance mode is the longitudinal or length-extensional vibration. Out-of-plane vibrations are not suppressed.

In FIG. 7b guides 72 are shown schematically. The longitudinal mode is the operated vibration and this movement is not hampered. The guides only restrict unwanted out-of-plane vibrations, and are designed to be (as far as possible) frictionless guides, which thus do not act on the desired mode of vibration, but completely restrict out-of-plane motion. The only construction material available is the substrate, typically a mono-crystalline slab of silicon, and it is desired to construct all device features in a single plane. This means it is not possible to attach physical bearings to the resonator (such as schematically shown in FIG. 7b).

Instead, the designs of the invention provide well-matched bodies attached to the main resonator body, acting as frictionless guiders in only one direction. This "matched" feature refers to the resonance frequency, as explained below.

FIGS. 8a and 8b show two simulated modes of vibration of a guided resonator of the invention. The longitudinal vibration in FIG. 8a is the intended principal mode of operation.

The design shown in FIG. 8 comprises a main resonator mass 80 (like the mass 205 in FIG. 2) and a length-extending member 82 (like the arms 20a or 20b in FIG. 2). In addition, there are two connecting arms 84 which function as guide portions which serve to suppress out-of-plane vibrations. These guide portions comprise arms 84 which extend at one end from the main resonator mass 80 to a fixed connection at the other end. The arms include portions that extend transversely of the principal direction of vibration, but in the same plane as the resonator mass. In the example shown, the arms have a "Z" shape, with a first portion 84a transverse to the vibration direction, a second portion 84b parallel to the vibration direction and a third portion 84c transverse to the vibration direction.

The resonator and the connecting arms have the same exactly matched resonance frequency in the principal vibration direction. Furthermore, the external fixed connections at the ends of the connecting arms 84 are at nodal points for the principal vibration mode. In FIG. 8b, a first out-of-plane bending mode of the system is shown. Since the frequency of this motion is not matched for resonator and connecting arms, there will be an acoustical impedance mismatch and energy will leak away to the surroundings. This motion is therefore heavily damped.

As mentioned before, attaching a vibrating structure at a nodal point is desired to minimise dissipative losses. In FIG. 8a the arms act as quarter wavelength-resonators, as known in acoustics. They do so, since their resonance frequency in the length-extensional direction of the resonator is perfectly matched to that of the resonator.

In FIG. 8b vibrational energy will leak away through the attached bodies, since the connection to the outside world is not made at a nodal point for that mode of vibration.

FIG. 9 shows possible resonator designs using the approach explained with reference to FIG. 8 as applied to the resonator design of FIG. 2.

Figure 9A:
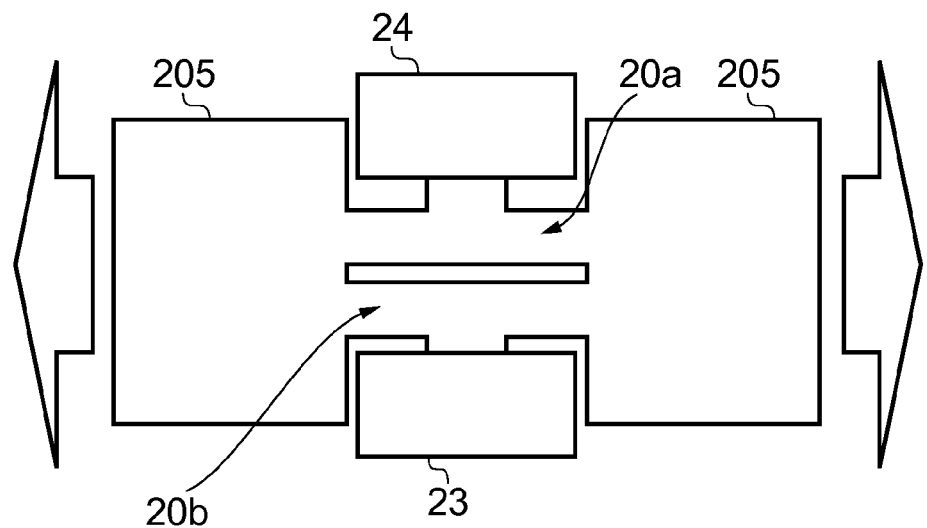
FIG. 9 shows three different applications of the invention to the type of resonator of FIG. 6.

FIG. 9a shows the resonator of FIG. 2 for reference. The anchor elements 23,24 are the points at which the resonator is fixed to the outside, and these are at nodal points, as a result of the symmetry of the resonator about a mirror axis perpendicular to the vibration direction (shown by arrows).

Figure 9B:
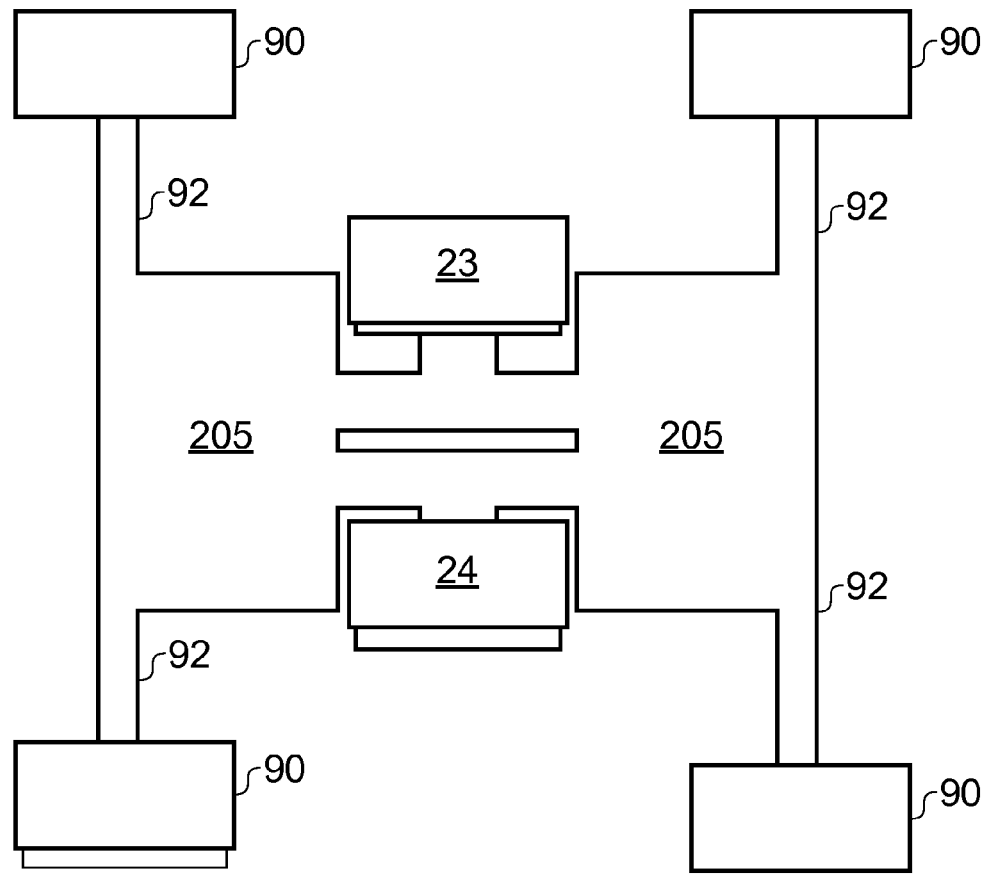

FIG. 9b shows a first example in accordance with the invention.

Each resonator mass 205 is connected to an additional anchor point 90 by a straight arm 92 which extends perpendicularly to the vibration axis. These function as simple cantilevers attached in a symmetric way.

FIG. 9c shows a second example in accordance with the invention. This has two straight parallel arms 94a,94b extending in one direction transverse to the vibration axis from each resonator mass, and two more straight parallel arms 94a,94b extending in the opposite direction from each resonator mass. Thus, each arm 92 of the design of FIG. 9b is split into two parallel arms, one at each end (along the vibration axis direction) of the resonator mass 205. This design suppresses more modes of vibration.

FIG. 9d modifies the arms 94a,94b of FIG. 9c to provide Z-shaped arms 96 as shown in FIG. 8, and these allow for stress release.

These designs show that the two opposite free ends of the resonator can be guided by using 4 or 8 identical guiding structures, which can be simple straight cantilevers or more complicated structures. To avoid introducing stresses in the resonator they can have a "Z" (or "S" shape).

These designs result in additional resonator suspensions (anchors).

In the example above, the desired resonance mode is the length-extensional mode and the parasitic modes have transversal vibration components. In principle the application can be extended to any case where the undesired modes have non-zero vibration components in a direction where the desired mode has a zero vibration component. For example, if the desired mode is a z-directed 30 bending mode, and the in-plane vibration can be suppressed.

The invention is also not limited to the dob-bone shaped example given—the resonator may be as shown in FIG. 1. Furthermore, even when a length-extensional design is used, it may be fixed at one end and free at the other.

In the examples explained above, the connecting arms are designed to have exactly the same resonant frequency as the resonator without arms. In principle, the resonant frequency of the connected resonator and arms should hence be the same.

However, any frequency can be designed, so that the connecting arms do influence the resonant frequency of the resulting structure, but that resonant frequency has the desired value. The connecting arms need to be designed so that the quality factor of the resonator does not deteriorate. In the examples above, the resonator alone has a high Q factor, and the arms are designed in the manner of a quarter-wavelength attachment, in order to confine mechanical energy to within the resonator. The vibrational energy then reflects at the fixation of the arms, rather than transmitting energy to the outside world.

The invention can be applied to any bulk-mode or length-extensional mode of operation. The invention is of particular interest for resonators that are thin with respect to width and length.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:
1. A resonator comprising:
    a resonator body coupled to a connecting arm to form a combined mass;
    a plurality of actuation electrodes for driving the resonator into a first resonant mode in a first plane, in which the combined mass vibrates parallel to a first axis in the first plane, and also driving the resonator into a second resonant mode not in the first plane; and a detection arrangement for detecting the vibration in the first axis direction and generating an electrical output signal derived from the vibration, wherein the resonator further comprises a first anchor arrangement at which the resonator is fixed in position, wherein the first anchor arrangement connects to the resonator body at a first nodal point of the first resonant mode, and wherein the resonator further comprises a second anchor arrangement, and wherein the connecting arm includes a first end coupled to the second anchor arrangement at a second nodal point of the first resonant mode, wherein the connecting arm includes a second end coupled to the resonator body at a non-nodal point; and wherein the second nodal point of the first resonant mode is also a non-nodal point of the second resonant mode.

2. A resonator as claimed in claim 1, wherein the connecting arm extends from the resonator body in a direction transverse to the first axis direction.

3. A resonator as claimed in claim 2, wherein the connecting arm has a same resonant frequency as a resonator mass for vibrations in the first axis direction, but a non-matched resonant frequency for vibrations in a transverse direction.

4. A resonator as claimed in claim 1, where the resonator body has two free ends and the first anchor arrangement connects to the resonator body centrally between the two free ends, and wherein at least one connecting arm connects to each free end.

5. A resonator as claimed in claim 1, wherein the resonator body further comprises a pair of expansion arms which extend along the first axis direction, with a head at each end of the pair of expansion arms, wherein the first anchor arrangement connects to the middle of the expansion arms and the connecting arm connects to the head.

6. A resonator as claimed in claim 5, further comprising a first connecting arm extending outwardly in a first direction transverse to the first axis direction from one head, a second connecting arm extending outwardly in a second opposite direction transverse to the first axis direction from the one head, a third connecting arm extending outwardly in the first direction transverse to the first axis direction from the other head and a fourth connecting arm extending outwardly in the second opposite direction transverse to the first axis direction from the other head.

7. A resonator as claimed in claim 5, further comprising a first pair of connecting arms extending outwardly in a first direction transverse to the first axis direction from one head, a second pair of connecting arms extending outwardly in a second opposite direction transverse to the first axis direction from the one head, a third pair of connecting arms extending outwardly in the first direction transverse to the first axis direction from the other head and a fourth pair of connecting arms extending outwardly in the second opposite direction transverse to the first axis direction from the other head.

8. A resonator as claimed in claim 1, wherein the or each connecting arm has a first portion transverse to the first axis direction, a second portion parallel to the first axis direction and a third portion transverse to the first axis direction.

9. A method of controlling a resonator which comprises a resonator body coupled to a connecting arm to form a combined mass and actuation electrodes for driving the resonator into a first resonant mode in a first plane, in which the combined mass vibrates parallel to a first axis in the first plane, and which also drive the resonator into a second resonant mode not in the first plane, the method comprising:

fixing the resonator at a first anchor arrangement, wherein the first anchor arrangement connects to the resonator body at a first nodal point of the first resonant mode, fixing the resonator at a second anchor arrangement, by connecting a first end of the connecting arm to the second anchor arrangement at a second nodal point of the first resonant mode, wherein the connecting arm includes a second end coupled to the resonator body at a non-nodal point, wherein the second nodal point of the first resonant mode is also a non-nodal point of the second resonant mode thereby suppressing the second resonant mode of vibration transverse to the first plane and avoiding damping of the first resonant mode in the first plane;

detecting the vibration in the first axis direction; and generating an electrical output signal derived from the vibration.

10. A resonator as claimed in claim 1, wherein the connecting arm coupling forms a quarter-wavelength-resonator in the first resonant mode.

* * * * *